United States Patent
Haga et al.

(10) Patent No.: US 7,391,206 B2
(45) Date of Patent: Jun. 24, 2008

(54) MAGNETIC DETECTION CIRCUIT AND ENCODER

(75) Inventors: Hiroshi Haga, Fuchu (JP); Mamoru Yamashita, Kiyose (JP)

(73) Assignee: Dr. Johannes Heidenhain GmbH, Traunreut (DE)

( * ) Notice: Subject to any disclaimer, the term of this patent is extended or adjusted under 35 U.S.C. 154(b) by 134 days.

(21) Appl. No.: 11/080,155

(22) Filed: Mar. 15, 2005

(65) Prior Publication Data

US 2005/0200352 A1 Sep. 15, 2005

(30) Foreign Application Priority Data

Mar. 15, 2004 (JP) .............................. 2004-073328

(51) Int. Cl.
*G01B 7/30* (2006.01)

(52) U.S. Cl. .............................. 324/207.25; 324/207.2; 324/207.21

(58) Field of Classification Search ............ 324/207.21, 324/207.24, 207.25, 252, 207.2, 251; 338/32 R, 338/32 H See application file for complete search history.

(56) References Cited

U.S. PATENT DOCUMENTS

| | | | | |
|---|---|---|---|---|
| 3,568,044 A | * | 3/1971 | Elazar | 323/367 |
| 3,846,697 A | * | 11/1974 | Cila et al. | 324/228 |
| 5,435,070 A | * | 7/1995 | Kilian | 33/361 |
| 5,731,702 A | * | 3/1998 | Schroeder et al. | 324/207.21 |
| 6,636,036 B1 | * | 10/2003 | Schroeder et al. | 324/207.21 |

FOREIGN PATENT DOCUMENTS

| | | | |
|---|---|---|---|
| EP | 201682 A1 | * | 11/1986 |
| EP | 233618 A2 | * | 8/1987 |
| JP | 58202804 A | * | 11/1983 |
| JP | 9-5413 | | 1/1997 |
| JP | 11-337368 | | 12/1999 |

* cited by examiner

*Primary Examiner*—Patrick Assouad
*Assistant Examiner*—David M. Schindler
(74) *Attorney, Agent, or Firm*—Kenyon & Kenyon LLP

(57) ABSTRACT

To provide a low-cost magnetic detection circuit, in which the differential detection function accomplished by outputting differential signals may not be lost, and which may be hardly affected by temperature fluctuations and may be resistant to noise, and in which the number of magnetic detection elements may be reduced, and to provide an encoder, the costs of which may be further reduced by using such a magnetic detection circuit for the multi-revolution detection part, etc., a magnetic detection circuit includes a bridge circuit formed by two bridge sections between the current-source terminal and the grounding terminal. The first bridge section and the second bridge section of the bridge circuit include magnetic detection elements MR1, MR2, respectively, and, viewed from the output-signal output points, the magnetic detection elements MR1, MR2 in the two bridge sections are arranged on only one of the sides that include the current-source side and the grounding-terminal side. An encoder includes such a magnetic detection circuit.

26 Claims, 4 Drawing Sheets

MAGNETIC DETECTION CIRCUIT AND ENCODER

CROSS-REFERENCE TO RELATED APPLICATIONS

The present application claims priority to Application No. 2004-073328 filed in Japan on Mar. 15, 2004, which is expressly incorporated herein in its entirety by reference thereto.

FIELD OF THE INVENTION

The present invention relates to a magnetic detection circuit, which may detect changes in magnetism and convert them into electrical signals. The present invention also relates to an encoder, which is a device that includes such a magnetic detection circuit, is attached to the rotor or rotating body of an engine, motor, etc., or to an object to be measured that is moving in a straight line, and determines the degree of positional displacement of the object to be measured, e.g., the number of revolutions and/or the angle of rotation or the movement position or the degree of movement.

BACKGROUND INFORMATION

There are many devices in which a magnetic detection circuit is used. Among these, coding devices, from which high precision and accurate operation is required, may be designated as being representative of examples of application. In general, multi-revolution coding devices are conventional as coding devices that have a magnetic detection circuit. In addition to an arrangement for determining the degree of positional displacement within one rotation, these encoders have a rotating magnetic body, which is referred to as a ring magnet for detecting multiple revolutions and is for determining number of revolutions from one revolution and beyond, and a magnetic detection circuit for detecting the change in magnetism of this rotating magnetic body. FIG. 8 illustrates the arrangement of a conventional multi-revolution encoder.

The encoder having the arrangement illustrated in FIG. 8 has: a rotating shaft 12, which is mounted, and therefore coupled, to a rotating body that is the object to be measured; bearings 15, which rotatably support this rotating shaft 12; and a base element 11, on which these bearings 15 are fixed. In order for the shaft of the rotating body to be attached, a through-hole 12a having approximately the same diameter as this shaft is formed in the lower region of rotating shaft 12. A code disc (slotted plate) 14 is mounted above the section on which bearings 15 are supported, and a rotating magnetic body (ring magnet) 16 is mounted above this code disc. A base plate 13, which is fixed to base element 11, is arranged above code disc 14 and faces this code disc. A light-receptor element 19, which is provided with a fixed slot 20, is mounted to base plate 13 at a point opposite to the code (slot) forming region of code disc 14, and electrically connected to circuits on the base plate. A light-generating element 21 is arranged beneath code disc 14 at a position corresponding to the mounting position of light-receptor element 19, so that the light produced by light-generating element 21 may be detected by light-receptor element 19 via the slots of code disc 14 and fixed slot 20. The degree of positional displacement within one revolution is measured, using light-generating element 21, code disc 14, light-receptor element 19, etc.

Rotating magnetic body 16 attached to rotating shaft 12 in the region above base plate 13 is arranged so that its magnetic poles reverse while making one revolution. A magnetic detection element 17, which detects the change in the magnetic poles, is positioned so that it faces the circumferential surface of the rotating magnetic body. A biasing magnet 18 for providing magnetic detection element 17 with a biasing magnetic field is formed on the side of magnetic detection element 17 opposite to the side facing the circumferential surface of the rotating magnetic body. Magnetic detection element 17 and biasing magnet 18 are mechanically and electrically connected to base plate 13.

Magnetoresistive elements may be used as magnetic detection elements. In the case of a multi-revolution detection circuit that uses magnetoresistive elements, a bridge circuit is formed, as illustrated in FIG. 9, for example, by two pairs of magnetoresistive elements, MR1 and MR2, as well as MR3 and MR4, which are arranged at points that are separated from one another by 180 degrees, so as to surround the rotating magnetic body. Differential signals are output via intermediate points n1 and n2. These differential signals are input into a comparator 5, a comparison or reference waveform is produced, and a detection signal f is obtained.

The circuit illustrated in FIG. 9 is a bridge circuit, which is formed between current-source terminal Vcc and grounding terminal GND. A bridge section made up of first magnetic detection element MR1, of which one terminal is connected on the side of the current-source terminal, and third magnetic detection element MR3, as well as an adjustable resistor R3 connected to a terminal of third magnetic detection element MR3, is provided on the one side of the bridge circuit. A bridge section made up of second magnetic detection element MR2, of which one terminal is connected on the side of the current-source terminal, and fourth magnetic detection element MR4, as well as a fixed resistor R4 connected to a terminal of fourth magnetic detection element MR4, is present on the other side of the bridge circuit. Intermediate point n1 between first magnetic detection element MR1 and third magnetic detection element MR3, and intermediate point n2 between second magnetic detection element MR2 and fourth magnetic detection element MR4 are each connected to a differential signal input of comparator CMP. The output of comparator CMP is connected to an output terminal n3.

The behavior of this circuit is explained in more detail. The revolutions of a rotating magnetic body (ring magnet), such as that illustrated in FIG. 4, in which half of the upper surface of a flat disk surface is magnetized as a north pole (and the back surface as a south pole) and the other half is magnetized as a south pole (and the back surface as a north pole), are detected, or the movements of a linear magnetic body (linear magnet), such as that illustrated in FIG. 5, which is arranged in a straight line, are detected. In the explanation below, the behavior in the case of using a rotating magnetic body is explained, but the behavior in the case of a linear magnetic body is approximately the same.

The magnetic field of the rotating magnetic body is initially sensed by magnetoresistive elements MR3 and MR2 and then, after a half revolution of the rotating magnetic body, by magnetoresistive elements MR1 and MR4. In this context, signals e1 and d1, which are illustrated in FIG. 7 and represent differential signals, are produced at intermediate points n1 and n2 of the bridge circuit, which is formed by the individual magnetoresistive elements. Afterwards, a comparison is made and a waveform is produced in comparator CMP, and the signal produced at output terminal n3 is a pulse, such as that illustrated in FIG. 7, which corresponds to one revolution. This pulse signal is used as a multiple-revolution detection signal of the rotary encoder (referred to in the following as "multi-revolution detection signal").

Although magnetoresistive elements may be expensive, such a bridge circuit requires the use of two pairs of magnetoresistive elements. Therefore, the detection circuit has component costs, which may represent a significant obstacle to reducing the cost of the encoder.

Magnetic detection circuits, which use magnetic detection elements such as magnetoresistive elements, are also described, for example, in Japanese Examined Patent Application Publication No. 2715997 (Japanese Published Patent Application No. 9-5413) and Japanese Published Patent Application No. 11-337368, but in both cases, nothing different is described beyond the fact that two magnetic detection elements, e.g., one pair, are arranged in both or in one of the bridge section that form the bridge circuit. In FIG. 3 of Japanese Published Patent Application No. 11-337368, the number of magnetic detection elements is reduced by one pair, and if only one pair is used in one of the bridge sections that form the bridge circuit, then no differential signals may be obtained in this arrangement.

SUMMARY

An example embodiment of the present invention may provide a low-cost magnetic detection circuit, in which a differential detection function accomplished by outputting differential signals is not lost, and which may be less affected by temperature fluctuations and may be resistant to noise, and in which the number of magnetic detection elements may be reduced. An example embodiment of the present invention may provide an encoder, the cost of which may be further reduced by using such a magnetic detection circuit for a multi-revolution detection part, etc.

According to an example embodiment of the present invention, a magnetic detection circuit includes a bridge circuit formed by two bridge sections between the current-source terminal and the grounding terminal, the first bridge section and the second bridge section of the bridge circuit each having a magnetic detection element, and, in both bridge sections, the magnetic detection element, viewed from the output-signal output points, are arranged on only one of the sides that include the current-source terminal side and the grounding-terminal side.

The output signals obtained from the output-signal output points of the two bridge sections may be differential signals.

According to an example embodiment of the present invention, an encoder includes a magnetic detection part, in which the above-mentioned magnetic detection circuit detects the changes in magnetism of a rotating magnetic body of a main part of an encoder, in order to measure the degree of positional displacement of an object to be measured.

The main part of the encoder may include at least a revolution detection part for measuring the degree of positional displacement and a multiple-revolution detection part for detecting one revolution and above, and the magnetic detection part may be arranged in the multiple-revolution detection part.

According to an example embodiment of the present invention, a magnetic detection circuit includes a bridge circuit including two bridge sections arranged between a current-source terminal and a grounding terminal, each of a first bridge section and a second bridge section of the bridge circuit including a magnetic detection element. In both the first bridge section and the second bridge section, the magnetic detection element is arranged, with respect to output-signal output points, on only one of (a) a side that includes the current-source terminal and (b) a side that includes the grounding terminal.

Output signals from the output-signal output points of the two bridge sections may include differential signals.

Each bridge section may include exactly one magnetic detection element.

The output-signal output points may be connected with differential input points of a comparator.

The comparator may be configured to feed back an output signal via a feedback resistor to one of the bridge sections.

According to an example embodiment of the present invention, a magnetic detection circuit includes bridge circuit means including two bridge section means arranged between current-source terminal means and grounding terminal means, each of first bridge section means and second bridge section means of the bridge circuit means including magnetic detecting means. In both the first bridge section means and the second bridge section means, the magnetic detecting means is arranged, with respect to output-signal output means, on only one of (a) a side that includes the current-source terminal means and (b) a side that includes the grounding terminal means.

Each bridge section means may include exactly one magnetic detecting means.

The output-signal output means may be connected with differential input means of comparator means.

The comparator means may feed back an output signal via a feedback resistor means to one of the bridge section means.

According to an example embodiment of the present invention, an encoder includes a magnetic detection part including a magnetic detection circuit configured to detect changes in magnetism of a rotating magnetic body of a main part of the encoder to measure a degree of positional displacement of an object to be measured, the magnetic detection circuit including a bridge circuit, the bridge circuit including two bridge sections arranged between a current-source terminal and a grounding terminal, each of a first bridge section and a second bridge section of the bridge circuit including a magnetic detection element. In both the first bridge section and the second bridge section, the magnetic detection element is arranged, with respect to output-signal output points, on only one of (a) a side that includes the current-source terminal and (b) a side that includes the grounding terminal.

Output signals from the output-signal output points of the two bridge sections may include differential signals.

The main part of the encoder may include at least a one-revolution detection part configured to measure the degree of positional displacement and a multiple-revolution detection part configured to detect at least one revolution, and the magnetic detection part may be arranged in the multiple-revolution detection part.

The multiple-revolution detection part may include a rotating ring magnet.

Since example embodiments of the present invention may allow the number of expensive magnetoresistive elements for detection to be reduced and also may allow a conventional differential input to be realized when signals are input into the comparator, a magnetic detection circuit, which is resistant to temperature changes and hardly affected by noise, may be provided without sacrificing the conventional differential detection function, and the use of this magnetic detection circuit may also allow the costs of an encoder to be reduced.

DETAILED DESCRIPTION

Figure 1:
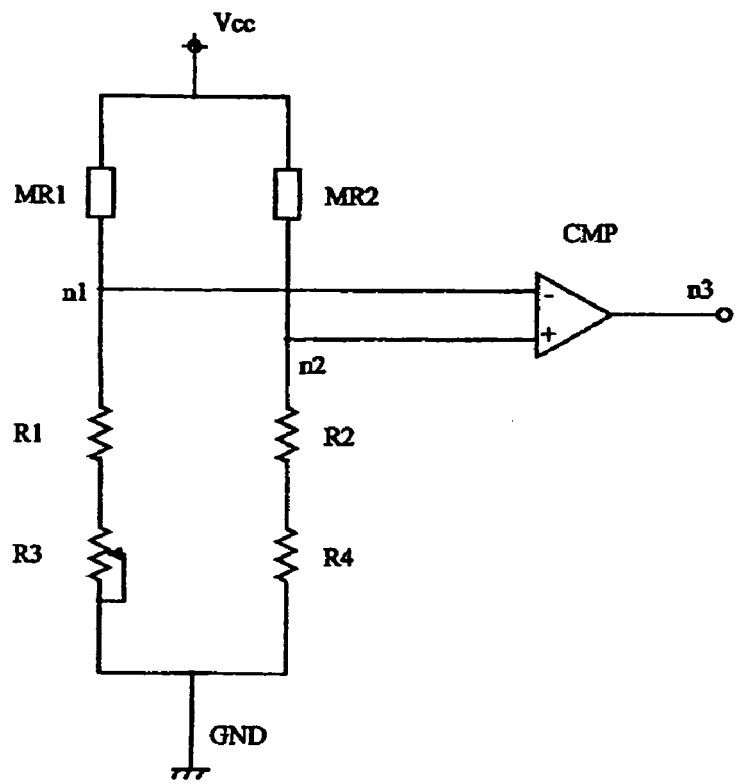
FIG. 1 is a circuit diagram, which illustrates a magnetic detection circuit of an example embodiment of the present invention.

The magnetic detection circuit of an example embodiment of the present invention has a bridge circuit formed by two bridge sections between the current-source terminal and the grounding terminal, the first bridge section and the second bridge section of the bridge circuit each having a magnetic detection element, and, in both bridge sections, the magnetic detection element, viewed from the output-signal output points, being arranged on only one of the current-source and grounding-terminal sides. The output signals obtained from the output-signal output points of the two bridge sections may be differential signals.

The main part of the encoder, which has this magnetic detection circuit, has at least a revolution detection part for measuring the degree of positional displacement and a multiple-revolution detection part for detecting one revolution and above, the magnetic detection circuit being arranged in the multiple-revolution detection part.

Therefore, since in each instance a magnetic detection element is arranged in the two bridge sections, which form the bridge circuit and extend from the current-source terminal to the grounding terminal, and since the magnetic detection element in the two bridge sections, viewed from the output-signal output points, is only arranged on one of the current-source terminal and grounding-terminal sides, the number of magnetic detection elements may be reduced. Since these magnetic detection elements may be expensive, the reduction of the number of magnetic detection elements may allow the costs of the magnetic detection circuits and the encoder using this circuit to be substantially decreased.

Since a magnetic detection element is arranged in both of the bridge sections that form the bridge circuit, then, in comparison with the case in which a pair of magnetic detection elements is only arranged on one side of the bridge circuit, not only are differential signals obtained, but also the impedance fluctuations of the two bridge sections may be arranged to be equal. That is, when magnetic detection elements are only arranged in one bridge section, the impedance fluctuations due to temperature coefficients of the magnetic detection elements and the resistance become different or variable and temperature changes bring about differences in the impedance of the two bridge sections, which is why noise may have a different effect in the two input signal lines. The effect of the noise of the two input signal lines becomes equal and the resistance to noise is also increased by arranging the bridge sections to have the same impedance and by arranging signals from the sensor to be differential signals.

It may be sufficient that the magnetic detection elements, as viewed from the output-signal output points of the two bridge sections that form the bridge circuit and extend from the current-source terminal to the grounding terminal, are only arranged on one of the current-source terminal and grounding-terminal sides. That is, only one magnetic detection element may need to be arranged in the two bridge sections. In this manner, compared to the conventional case in which two groups of magnetic detection element pairs, and therefore four magnetic detection elements, are arranged in the bridge circuit, the number of magnetic detection elements present in the bridge circuit may be reduced by one pair. Since magnetic detection elements are generally used in pairs having two parts per group, they are only arranged on one of the current-source terminal and grounding-terminal sides, as viewed from the output-signal output points of the two bridge sections. In such a case, the center point or connection point of the pair of magnetic detection elements is connected to one of the current-source and grounding-terminal sides.

A magnetic detection element is an element, which detects the magnetic pole or the change in magnetism of an object to be detected, such as, for example, a magnetic body. A MR element (magnetoresistive element) may be used, but a magnetic-detection element having the same or similar function as, e.g., a Hall element, etc., may also be used.

An encoder is explained as a representative device, in which the magnetic detection circuit of an example embodiment of the present invention is used. As far as the basic arrangement of the main part of the encoder is concerned, it may be provided with a code disc (slot plate) which may be necessary for measuring the degree of positional displacement and specifically the degree of revolution of the object to be measured, optical elements which may be necessary for detecting the code (of the slots) of the code disc, a magnet element for detecting one revolution and above and the direction of rotation, magnetic detection elements for detecting the change in magnetism of the magnet element, and if necessary, electrical circuits, etc., for processing the signals received from the individual elements. The optical system, which has the optical elements, and the code disc may also be replaced by magnetic detection elements and magnetic materials. For example, the object to be measured may be a motor or an internal combustion engine or the rotating structure, which is connected to it and transmits the rotational action, or the rotating structure following this rotational action.

A rotating magnetic body referred to as a ring magnet, etc., may be used as a magnetic element, but it should be understood that example embodiments of the present invention are not limited to this, as long as it is an arrangement, in which successive magnetic fields are formed in the circumferential direction or in the direction of rotation and, in addition, the magnetic poles or the magnetism changes within one revolution. In the case of a linear encoder, etc., a linear magnetic body having a structure, in which consecutive, linear magnetic fields are formed and a change in the magnetic poles or the magnetism additionally occurs at specific intervals, may also be used. Many different materials that may normally be used as a magnet may be used as the magnetic material of the rotating magnetic body or the linear magnetic body.

In the case of the magnetic detection elements, a biasing magnetic field may be exerted, and in such a case, a so-called biasing magnet is arranged in the vicinity. This biasing magnet is not restricted, as long as it is a magnetic body that exerts a biasing magnetic field, but since it may be provided for a magnetic field to be exerted that is equal to the magnetic field of the rotating magnetic body, it may be provided that the same material may be used as for the rotating magnetic body. However, it is also possible to use other magnetic materials to the extent that the magnetic characteristics, such as the required magnetic field intensity, are not affected, and in certain cases, it is also possible to use other magnetic materials with the object of adjusting the magnetic characteristics.

As far as the mounting positions of the magnetic detection elements are concerned, the positional relationship of the magnetic detection elements should be such that, in the case of using a rotating magnetic body as indicated above, the revolutions of the rotating magnetic body are obtained within one revolution. Generally, a pair of magnetic detection elements is positioned such that, when the magnetism of the rotating magnetic body is detected by one of these elements, no detection by the other element occurs.

There are substantially no limits to comparator CMP, as long as it is an element which is capable of comparing or determining the potential difference of the two input voltages and generating a corresponding output pulse. A type of integrated circuit referred to as a comparator IC may be used, but this does not constitute a limitation, and instead, an operational amplifier, or a logical IC, etc., having an analog input function, or a processor, may also be used, an ideal element needing to be selected in view of the power consumption of the circuit, the operating speed, the size of the elements, etc.

A magnetic detection part includes the magnetic detection elements, the rotating magnetic body (the linear magnetic body), the biasing magnet, and the electrical circuits for detection, such as the comparator and the bridge circuit. The magnetic detection part may be arranged in the multi-revolution detection part of the main part of the encoder, but when, as mentioned above, a magnetic detection element and magnetic materials are used in place of the optical system in the revolution-detection part for measuring the degree of positional displacement, then the revolution-detection part also has a magnetic detection part. In the case of a linear encoder, the magnetic detection part is arranged inside a part for detecting certain distances, etc.

EXAMPLE EMBODIMENT 1

In the following, example embodiments of the present invention are explained with reference to the Figures. FIG. 1 is a circuit diagram, which illustrates a region of the magnetic detection part of an encoder having a magnetic detection circuit according to an example embodiment of the present invention. The circuit diagram illustrated in FIG. 1 is of a bridge circuit and a detection element arranged between current-source terminal Vcc and grounding terminal GND. Two bridge sections, a first bridge section and a second bridge section, are provided in this bridge circuit between the current-source terminal and the grounding terminal. The first bridge section has a first magnetic detection element MR1 of which one terminal is connected to the current-source terminal, a first fixed resistor R1 of which one terminal is connected to the other terminal of first magnetic detection element MR1, and an adjustable resistor R3 which is connected to the other terminal of first fixed resistor R1. The second bridge section has a second magnetic detection element MR2 of which one terminal is connected to the current-source terminal, a second fixed resistor R2 of which one terminal is connected to the other terminal of second magnetic detection element MR2, and a fixed resistor R4 connected to the other terminal of second fixed resistor R2. The other terminals of adjustable resistor R3 and third fixed resistor R4 are each connected to the grounding terminal.

The resistances and artificial resistances on the two sides of the bridge are set so that a specific potential difference may be extracted from the output-signal output points of the bridge due to the action of the magnetic detection elements. These output-signal output points n1, n2, which are connecting points, may also be regarded as measuring points, at which a level having a state of equilibrium destroyed by the scanning of the magnetic detection elements may be monitored. Consequently, when external interference factors, such as a feedback input signal, are not present, output-signal output points n1, n2 may be assumed to be intermediate points of the electric potential in the bridge sections when the bridge circuit is balanced. The intermediate point potential may be set to any arbitrary value, not only to the value $V_{cc}/2$.

Output-signal output point n1, which corresponds to the connecting point of first magnetic detection element MR1 and first fixed resistor R1, and second output-signal output point n2, which corresponds to the connecting point of second magnetic detection element MR2 and second fixed resistor R2, are each connected to the differential input of comparator CMP. The output of comparator CMP is connected to an output terminal n3.

Resistors having a value approximately equal to the resistance value of magnetic detection elements MR1, MR2 in the magnetic non-detection state may be used for first fixed resistor R1 and second fixed resistor R2, while a resistor having a resistance value that is approximately half of the highest resistance value of adjustable resistor R3 may be used for third fixed resistor R4.

These resistance values may be adjusted to ideal values, taking into consideration the stability of the circuits, the input and output characteristics of comparator CMP, the power consumption, etc. In addition to the above-mentioned elements, elements or circuits for stabilizing the circuits, such as elements or circuits for suppressing voltage or current fluctuations or for suppressing the effect of temperature changes, may be added.

The behavior of the circuit is explained in the following.

Figure 4:
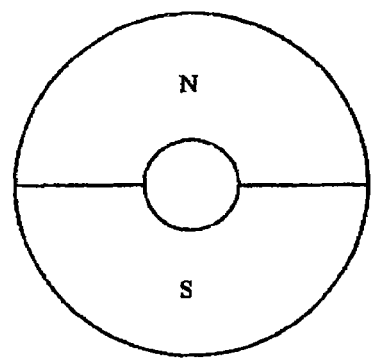
FIG. 4 is a schematic view illustrating the arrangement of a rotating magnetic body.
Figure 5:
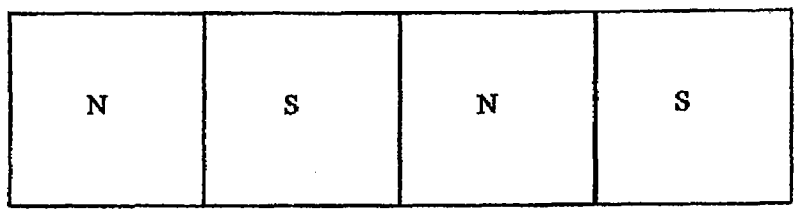
FIG. 5 is a schematic view illustrating the arrangement of a linear magnetic body.

In this connection, an example is illustrated in which highly magnetic, magnetoresistive elements are used for the magnetic detection elements. The resistance decreases when the magnetic detection elements sense a magnetic field. It is assumed that a rotating magnetic body (ring magnet), such as the one illustrated, for example, in FIG. 4, where half of a flat disk surface is magnetized as a north pole and the other half is magnetized as a south pole, rotates, and that the magnetic field of the rotating magnetic body is initially sensed (detected) by second magnetic detection element MR2. In the process, the resistance value of second magnetic detection element MR2 decreases and electrical potential e2 of second output-signal output point n2 increases. Simultaneously to this, the detection of the magnetism by first magnetic detection element MR1 stops, the resistance value that had decreased returns to the original value, and electrical potential d2 of first output-signal output point n1 falls to an electrical potential in the state of equilibrium When the rotating magnetic body turns one half of a revolution, first magnetic detection element MR1 senses it, and the resistance value decreases, while electrical potential d2 at first output-signal output point n1 increases. Simultaneously to this, the detection of the magnetism by second magnetic detection element MR2 stops, the resistance value that had decreased returns to the original value, and electrical potential e2 of second output-signal output point n2 falls to an electrical potential in the state of equilibrium. This above-mentioned behavior continually occurs due to revolutions of the rotating magnetic body.

Figure 3:
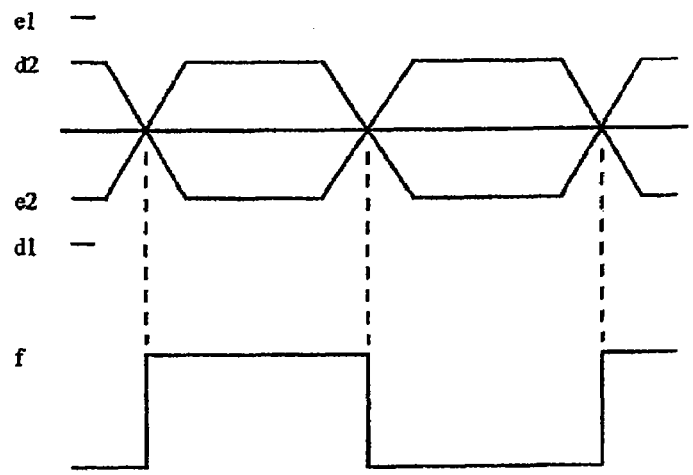
FIG. 3 is a voltage-waveform representation, which illustrates the behavior of a bridge circuit that is a magnetic detection circuit of an example embodiment of the present invention.

Electric potential d2 of output-signal output point n1 and electrical potential e2 of output-signal output point n2 generate differential signals, as illustrated in FIG. 3. Output voltages e2, d2 obtained are lower than electrical potentials e1, d1 in the case of using the conventional two pairs of magnetic detection elements.

Figure 6:
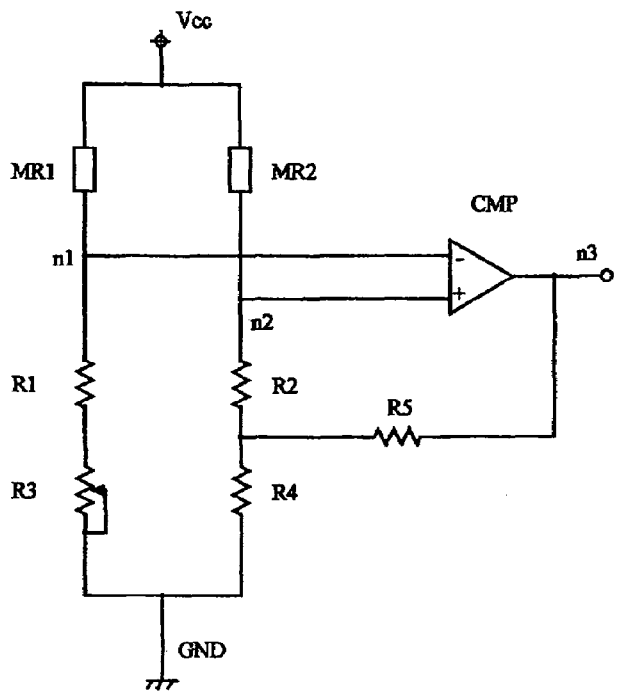
FIG. 6 is a circuit diagram illustrating a state, in which a feedback resistor is provided.
Figure 7:
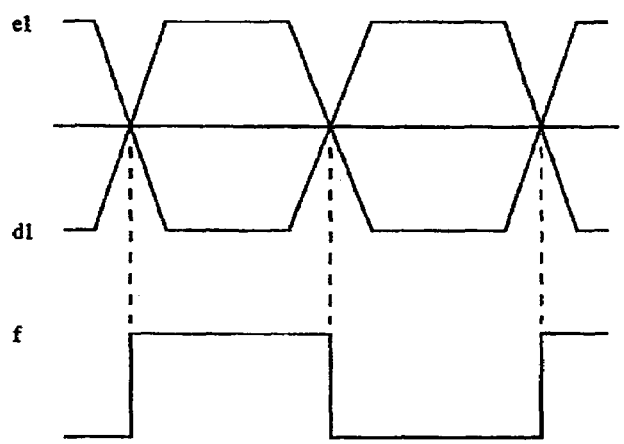
FIG. 7 is a voltage-waveform representation, which illustrates the behavior of a bridge circuit that is a conventional magnetic detection circuit.
Figure 8:
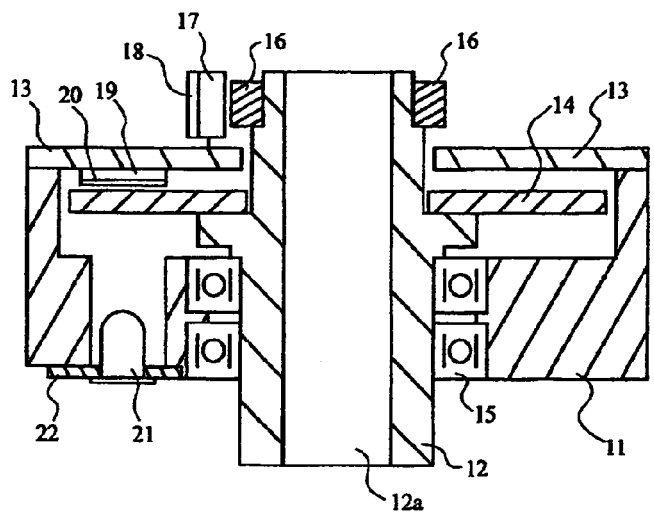
FIG. 8 is a cross-sectional view illustrating the construction of a conventional encoder.
Figure 9:
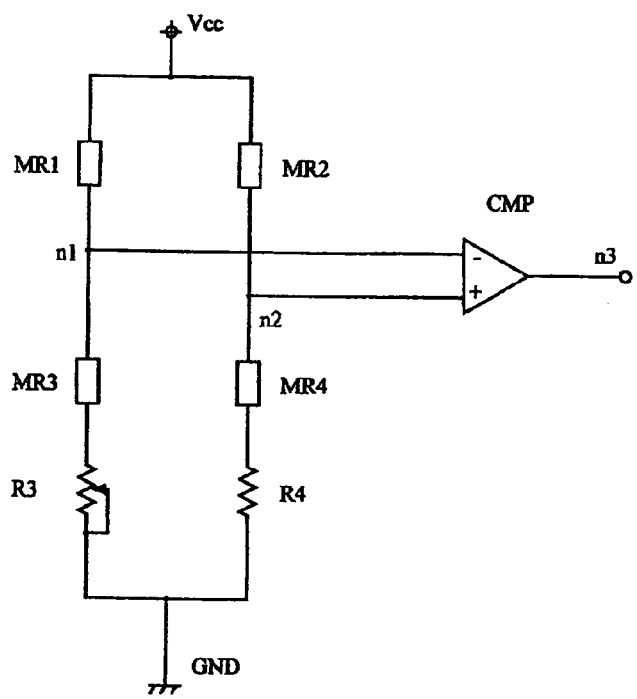
FIG. 9 is a diagram of the magnetic-detection bridge circuit of a conventional encoder.

By inputting the signals of output-signal output points n1, n2 into comparator CMP and comparing them and amplifying them, an output signal, for which the differential signals are compared and amplified, is obtained at output terminal n3. As illustrated in FIG. 6, a feedback resistor R5 may be added and the output of comparator 3 may be connected via this feedback resistor R5 to the connecting point of second fixed resistor R2 with fourth fixed resistor R4.

The feeding back of the output signal to the second bridge section via feedback resistor R5 allows the comparator input to be given hysteresis characteristics and allows a stable output signal to be generated.

EXAMPLE EMBODIMENT 2

Figure 2:
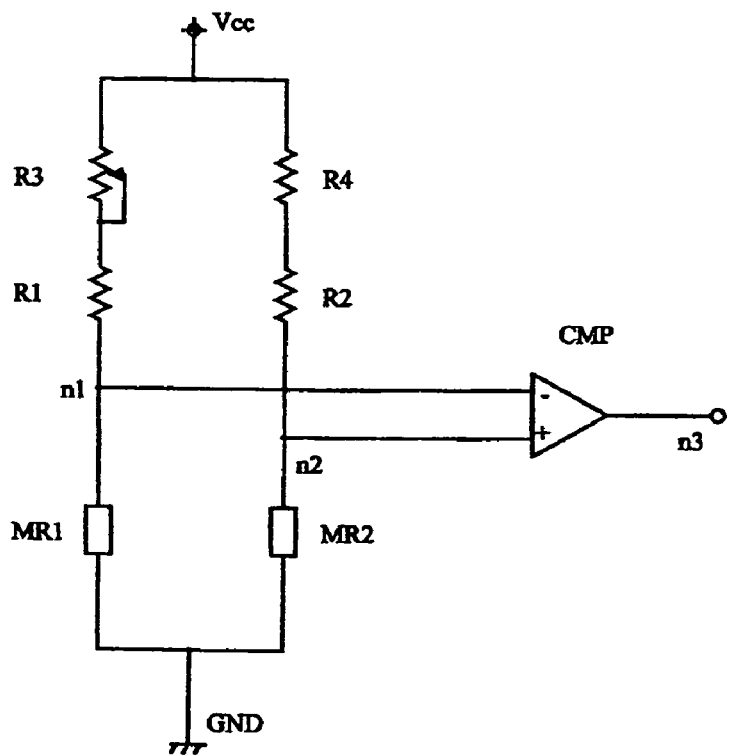
FIG. 2 is a circuit diagram, which illustrates a magnetic detection circuit of an example embodiment of the present invention.

FIG. 2 is a circuit diagram, which illustrates a region of the magnetic detection part of an encoder having a magnetic detection circuit according to an example embodiment of the present invention. In this example, the pair of magnetic detection elements MR1, MR2 is positioned closer to the grounding terminal than output-signal output points n1, n2. That is, the first bridge section has an adjustable resistor R3 of which one terminal is connected to the current-source terminal, a first fixed resistor R1 of which one terminal is connected to the other terminal of adjustable resistor R3, and a first magnetic detection element MR1 connected to the other terminal of first fixed resistor R1, while the second bridge section has a third fixed resistor R4 of which one terminal is connected to the current-source terminal, a second fixed resistor R2 of which one terminal is connected to the other terminal of third fixed resistor R4, and a second magnetic detection element MR2 connected to the other terminal of second fixed resistor R2. The other terminals of the pair of magnetic detection elements MR1, MR2 are each connected to the grounding terminal.

First output-signal output point n1, which represents the connecting point of first magnetic detection element MR1 and second fixed resistor R1, and second output-signal output point n2, which represents the connecting point of second magnetic detection element MR2 and second fixed resistor R2, are each connected to the differential input of comparator CMP. The output of comparator CMP is connected to output terminal n3. The further arrangement approximately corresponds to that illustrated in FIG. 1. Identical or similar components are provided with the same reference numerals. No explanation of them is given.

The behavior of the circuit is explained in the following.

An example is also explained in which highly magnetic, magnetoresistive elements are used for the magnetic detection elements.

It is assumed that during the rotation of the rotating magnetic body, the magnetic field of the rotating magnetic body was sensed (detected), for example, by second magnetic detection element MR2. In the process, the resistance value of second magnetic detection element MR2 decreases and electrical potential e2 of second output-signal output point n2 falls. Simultaneously to this, the detection of the magnetism by first magnetic detection element MR1 stops, the resistance value that had decreased returns to the original value, and electrical potential d2 of first output-signal output point n1 rises to an electrical potential in the state of equilibrium.

When rotating magnetic body turns one half of a revolution, first magnetic detection element MR1 senses it, and the resistance value decreases, while electrical potential d2 at first output-signal output point n1 decreases. Simultaneously to this, the detection of the magnetism by second magnetic detection element MR2 stops, the resistance value that had decreased returns to the original value, and electrical potential e2 of second output-signal output point n2 rises to an electrical potential in the state of equilibrium. The revolutions of the rotating magnetic body cause this above-mentioned behavior to occur continually, and electrical potential d2 of first output-signal output point n1 and electrical potential e2 of second output-signal output point n2 form the reverse state of the differential signals as illustrated in FIG. 3.

The further behavior approximately corresponds to that of FIG. 1. Therefore, it is understandable that even when the pair of magnetic detection elements MR1, MR2 is arranged closer to grounding terminal GND than output-signal output points n1, n2, the behavior of output-signal output points n1, n2 is indeed reversed, but the behavior is otherwise the same.

In the case of the above-mentioned example embodiments, examples, in which the magnetic detection circuit in the magnetic detection part of an encoder is used, are illustrated and explained, in order to simplify the explanation. However, it should be understood that example embodiments of the present invention are not restricted to encoders, but may be widely used in magnetic detection circuits which behave as specified above, and in devices in which these magnetic detection circuits are used.

As explained above, example embodiments of the present invention may allow differential signals to be obtained, when the number of magnetic detection elements, of which two pairs were conventionally needed, is reduced to one pair, and in spite of maintaining the capability of processing signals according to the differential method, it may become possible to considerably reduce the costs of the magnetic detection circuit and the encoder.

Example embodiments of the present invention may be used in magnetic detection circuits which perform magnetic detection by use of magnetic detection elements and a bridge-like circuit, and in devices which conduct measurements by use of this magnetic detection circuit, such as, e.g., encoders, which are used for detecting the position of many different moving parts, such as moving members of industrial machines such as robots, or even movable machines, automobiles, airplanes, etc. It is a technique, which may be particularly suitable for multi-revolution absolute-value encoders, but may be additional used in rotary-magnet encoders, linear encoders, etc.

LIST OF REFERENCE CHARACTERS

MR1, MR2 magnetic detection element
MR3, MR4 magnetic detection element
CMP comparator
R1 first fixed resistor
R2 second fixed resistor
R3 adjustable resistor
R4 third fixed resistor
R5 feedback resistor
12 rotating shaft 12a through-hole
13 base plate
14 code disc
15 bearing
16 rotating magnetic body (ring magnet)
17 magnetic detection element
18 biasing magnet
19 light-receptor element
20 fixed slot
21 light-generating element
22 supporting base plate

What is claimed is:

1. A magnetic detection circuit, comprising:
   a bridge circuit including two bridge sections arranged between a current-source terminal and a grounding terminal, each of a first bridge section and a second bridge section of the bridge circuit including a magnetic detection element;
   wherein, in both the first bridge section and the second bridge section, the magnetic detection element is arranged, with respect to output-signal output points, on only one of (a) a side that includes the current-source terminal and (b) a side that includes the grounding terminal;
   wherein the output-signal output points are connected with differential input points of a comparator;
   wherein the comparator is configured to feed back an output signal via a feedback resistor to one of the bridge sections;
   wherein the first bridge section includes a first fixed resistor and an adjustable resistor, a first terminal of the first fixed resistor connected to a terminal of the magnetic detection element of the first bridge section, a second terminal of the first fixed resistor connected to the adjustable resistor; and
   wherein the second bridge section includes a second fixed resistor and a third fixed resistor, a first terminal of the second fixed resistor connected to a terminal of the magnetic detection element of the second bridge section, a second terminal of the second fixed resistor connected to the third fixed resistor.

2. The magnetic detection circuit according to claim 1, wherein output signals from the output-signal output points of the two bridge sections include differential signals.

3. The magnetic detection circuit according to claim 1, wherein each bridge section includes exactly one magnetic detection element.

4. The encoder according to claim 1, wherein the main part of the encoder includes at least a one-revolution detection part configured to measure the degree of positional displacement and a multiple-revolution detection part configured to detect at least one revolution, the magnetic detection part arranged in the multiple-revolution detection part.

5. The encoder according to claim 4, wherein the multiple-revolution detection part includes a rotating ring magnet.

6. The magnetic detection circuit according to claim 1, wherein a specific potential difference is extractable from the output-signal output points based on detection by the magnetic detection elements in accordance with resistances of individual resistors of the two bridge sections and resulting resistances of the two bridge sections.

7. The magnetic detection circuit according to claim 1, wherein resistances of the first resistor and the second fixed resistor are approximately equal to resistances of the magnetic detection elements, and a resistance of te third fixed resistor is approximately one-half of a highest resistance of the adjustable resistor.

8. The magnetic detection circuit according to claim 1, wherein resistance values of all of the resistors are selected in accordance with circuit stability, input and output characteristics of the comparator and power consumption.

9. The magnetic detection circuit according to claim 1, wherein the output-signal output point of the first bridge section is in between the magnetic detection element of the first bridge section and the first fixed resistor, and the output-signal output point of the second bridge section is in between the magnetic detection element of the second bridge section and the second fixed resistor.

10. The magnetic detection circuit according to claim 1, wherein a terminal of the feedback resistor is connected between the second fixed resistor and the third fixed resistor.

11. A magnetic detection, comprising:
    bridge circuit means including two bridge section means arranged between current-source terminal means and grounding terminal means, each of first bridge section means and second bridge section means of the bridge circuit means including magnetic detecting means;
    wherein, in both the first bridge section means and the second bridge section means, the magnetic detecting means is arranged, with respect to output-signal output means, on only one of (a) a side that includes the current-source terminal means and (b) a side that includes the grounding terminal means;
    wherein the output-signal output means are connected with differential input means of comparator means;
    wherein the comparator means feeds back an output signal via a feedback resistor means to one of the bridge section means;
    wherein the first bridge section means includes first fixed resistor means and adjustable resistor means, a first terminal of the first fixed resistor means connected to a terminal of the magnetic detecting means of the first bridge section means, a second terminal of the first fixed resistor means connected to the adjustable resistor means; and
    wherein the second bridge section means includes second fixed resistor means and third fixed resistor means, a first terminal of the second fixed resistor means connected to a terminal of the magnetic detecting means of the second bridge section means, a second terminal of the second fixed resistor means connected to the third fixed resistor means.

12. The magnetic detection circuit according to claim 11, wherein each bridge section means includes exactly one magnetic detecting means.

13. The magnetic detection circuit according to claim 11, wherein a specific potential difference is extractable from the output-signal output point means based on detection by the magnetic detecting means in accordance with resistances of individual resistor means of the two bridge section means and resulting resistances of the two bridge section means.

14. The magnetic detection circuit according to claim 11, wherein resistances of the first fixed resistor means and the second fixed resistor means are approximately equal to resistances of the magnetic detecting means, and a resistance of the third fixed resistor means is approximately one-half of a highest resistance of the adjustable resistor means.

15. The magnetic detection circuit according to claim 11, wherein resistance values of all of the resistor means are selected in accordance with circuit stability, input and output characteristics of the comparator and power consumption.

16. The magnetic detection circuit according to claim 11, wherein the output-signal output means of the first bridge section means is in between the magnetic detecting means of the first bridge section means and the first fixed resistor, and the output-signal output means of the second bridge section means is in between the magnetic detecting means and the second fixed resistor means.

17. The magnetic detection circuit according to claim 11, wherein a terminal of the feedback resistor means is connected between the second fixed resistor means and the third fixed resistor means.

18. An encoder, comprising:
   a magnetic detection part including a magnetic detection circuit configured to detect changes in magnetism of a rotating magnetic body of a main part of the encoder to measure a degree of positional displacement of an object to be measured, the magnetic detection circuit including a bridge circuit, the bridge circuit including two bridge sections arranged between a current-source terminal and a grounding terminal, each of a first bridge section and a second bridge section of the bridge circuit including a magnetic detection element;
   wherein, in both the first bridge section and the second bridge section, the magnetic detection element is arranged, with respect to output-signal output points, on only one of (a) a side that includes the current-source terminal and (b) a side that includes the grounding terminal;
   wherein a comparator is configured to feed back an output signal via a feedback resistor to one of the bridge sections;
   wherein the first bridge section includes a first fixed resistor and an adjustable resistor, a first terminal of the first fixed resistor connected to a terminal of the magnetic detection element of the first bridge section, a second terminal of the first fixed resistor connected to the adjustable resistor; and
   wherein the second bridge section includes a second fixed resistor and a third fixed resistor, a first terminal of the second fixed resistor connected to a terminal of the magnetic detection element of the second bridge section, a second terminal of the second fixed resistor connected to the third fixed resistor.

19. The encoder according to claim 18, wherein output signals from the output-signal output points of the two bridge sections include differential signals.

20. The encoder according to claim 18, wherein each bridge section includes exactly one magnetic detection element.

21. The encoder according to claim 18, wherein the output-signal output points are connected with differential input points of the comparator.

22. The encoder according to claim 18, wherein a specific potential difference is extractable from the output-signal output points based on detection by the magnetic detection elements in accordance with resistances of individual resistors of the two bridge sections and resulting resistances of the two bridge sections.

23. The encoder according to claim 18, wherein resistances of the first fixed resistor and the second fixed resistor are approximately equal to resistances of the magnetic detection elements, and a resistance of the third fixed resistor is approximately one-half of a highest resistance of the adjustable resistor.

24. The encoder according to claim 18, wherein resistance values of all of the resistors are selected in accordance with circuit stability, input and output characteristics of the comparator and power consumption.

25. The encoder according to claim 18, wherein the output-signal output point of the first bridge section is in between the magnetic detection element of the first bridge section and the first fixed resistor, and the output-signal output point of the second bridge section is in between the magnetic detection element of the second bridge section and the second fixed resistor.

26. The encoder according to claim 18, wherein a terminal of the feedback resistor is connected between the second fixed resistor and the third fixed resistor.

* * * * *